(12) United States Patent
Kim et al.

(10) Patent No.: US 9,269,740 B2
(45) Date of Patent: *Feb. 23, 2016

(54) THIN FILM TRANSISTOR ARRAY SUBSTRATE FOR DIGITAL PHOTO-DETECTOR

(71) Applicants: LG Display Co., Ltd., Seoul (KR); Nan-Mi Lee, Daegu (KR)

(72) Inventors: Dae-Kyu Kim, Gyeongsangbuk-do (KR); Sung-Il Park, Daegu (KR); Sung-Bong Ha, Daegu (KR)

(73) Assignee: LG Display Co., Ltd., Seoul (KR)

( * ) Notice: Subject to any disclaimer, the term of this patent is extended or adjusted under 35 U.S.C. 154(b) by 38 days.

This patent is subject to a terminal disclaimer.

(21) Appl. No.: 14/089,897

(22) Filed: Nov. 26, 2013

(65) Prior Publication Data

US 2014/0145198 A1    May 29, 2014

(30) Foreign Application Priority Data

Nov. 27, 2012  (KR) .......................... 10-2012-0134961

(51) Int. Cl.
*H01L 31/113*  (2006.01)
*H01L 27/146*  (2006.01)

(52) U.S. Cl.
CPC ................................ *H01L 27/14658* (2013.01)

(58) Field of Classification Search
CPC ............ H01L 27/14603; H01L 27/14658; H01L 31/085; H01L 31/115; G06F 3/0412; G06F 3/042; G02F 1/13338; G02F 2001/13312
USPC ..................................... 257/74, 291–292, 428
See application file for complete search history.

(56) References Cited

U.S. PATENT DOCUMENTS

| | | |
|---|---|---|
| 5,480,810 A | 1/1996 | Wei et al. |
| 2001/0048489 A1 | 12/2001 | Izumi et al. |

(Continued)

FOREIGN PATENT DOCUMENTS

| | | |
|---|---|---|
| CN | 101561505 A | 10/2009 |
| EP | 1 936 694 694 A2 | 6/2008 |
| EP | 1 936 694 A2 | 6/2008 |

OTHER PUBLICATIONS

Search Report dated Dec. 2, 2014 from the United Kingdom in counterpart application No. GB1317346.3.

(Continued)

*Primary Examiner* — Dung Le
(74) *Attorney, Agent, or Firm* — Morgan, Lewis & Bockius LLP (57) ABSTRACT

A thin film transistor array substrate for a digital photo-detector is provided. The thin film transistor array substrate includes a plurality of gate lines to supply a scan signal; a plurality of data lines to output data, the data lines arranged in a direction crossing the gate lines, wherein cell regions are defined by the gate lines and the data lines; a photodiode in each of the cell regions to perform photoelectric conversion; and a thin film transistor at each intersection between the gate lines and the data lines to turn on according to the scan signal of the gate lines and output the photoelectric conversion signal from the photodiode to the data lines. A contact area between a source electrode of the thin film transistor and a first electrode of the photodiode is at a portion outside an area covered by a photodiode region.

10 Claims, 7 Drawing Sheets

(56) References Cited

U.S. PATENT DOCUMENTS

| | | | |
|---|---|---|---|
| 2002/0005520 A1 | 1/2002 | Mochizuki et al. | |
| 2005/0078231 A1 | 4/2005 | Lee et al. | |
| 2005/0146648 A1* | 7/2005 | Yang et al. | 349/42 |
| 2008/0245968 A1* | 10/2008 | Tredwell et al. | 250/370.09 |
| 2009/0053843 A1 | 2/2009 | Den Boer et al. | |
| 2011/0180889 A1 | 7/2011 | Jung et al. | |
| 2014/0145252 A1* | 5/2014 | Kim et al. | 257/292 |

OTHER PUBLICATIONS

Combined Search and Examination Report dated Feb. 27, 2014 from the United Kingdom in counterpart application No. GB1317346.3.
First Notification of Office Action dated Nov. 17, 2015 from The State Intellectual Property Office of China in counterpart application No. 201310459949.3.

* cited by examiner

THIN FILM TRANSISTOR ARRAY SUBSTRATE FOR DIGITAL PHOTO-DETECTOR

This application claims the benefit of Korean Patent Application No. 10-2012-0134961, filed on Nov. 27, 2012, which is hereby incorporated by reference as if fully set forth herein.

BACKGROUND OF THE INVENTION

1. Field of the Invention

The present invention relates to a digital photo-detector, and more specifically, to a thin film transistor array substrate for a digital photo-detector having reduced leakage current.

2. Discussion of the Related Art

An X-ray is a short wavelength radiation that easily passes through a subject, and transmittance of X-rays depends on a density of the subject. That is, inner characteristics of the subject may be indirectly observed through amount of X-rays passing through the subject.

An X-ray detector is a device that detects an amount of X-ray passing through the subject. The X-ray detector detects transmittance of X-ray and displays the inner characteristics of the subject on a display device. The X-ray detector may be generally used as a medical inspector, a non-destructive inspector, or the like.

In recent years, a digital X-ray detector using digital radiography (hereinafter referred to as a "DR") without using a film is widely used as an X-ray detector. Each cell of a thin film transistor array for a digital X-ray detector includes a photo-diode (PIN diode) that receives X-rays, converts the X-rays into visible light, and converts the visible light into an electric signal. A thin film transistor that is formed under the photo-diode outputs the electric signal from the photodiode to a data line.

Figure 1:
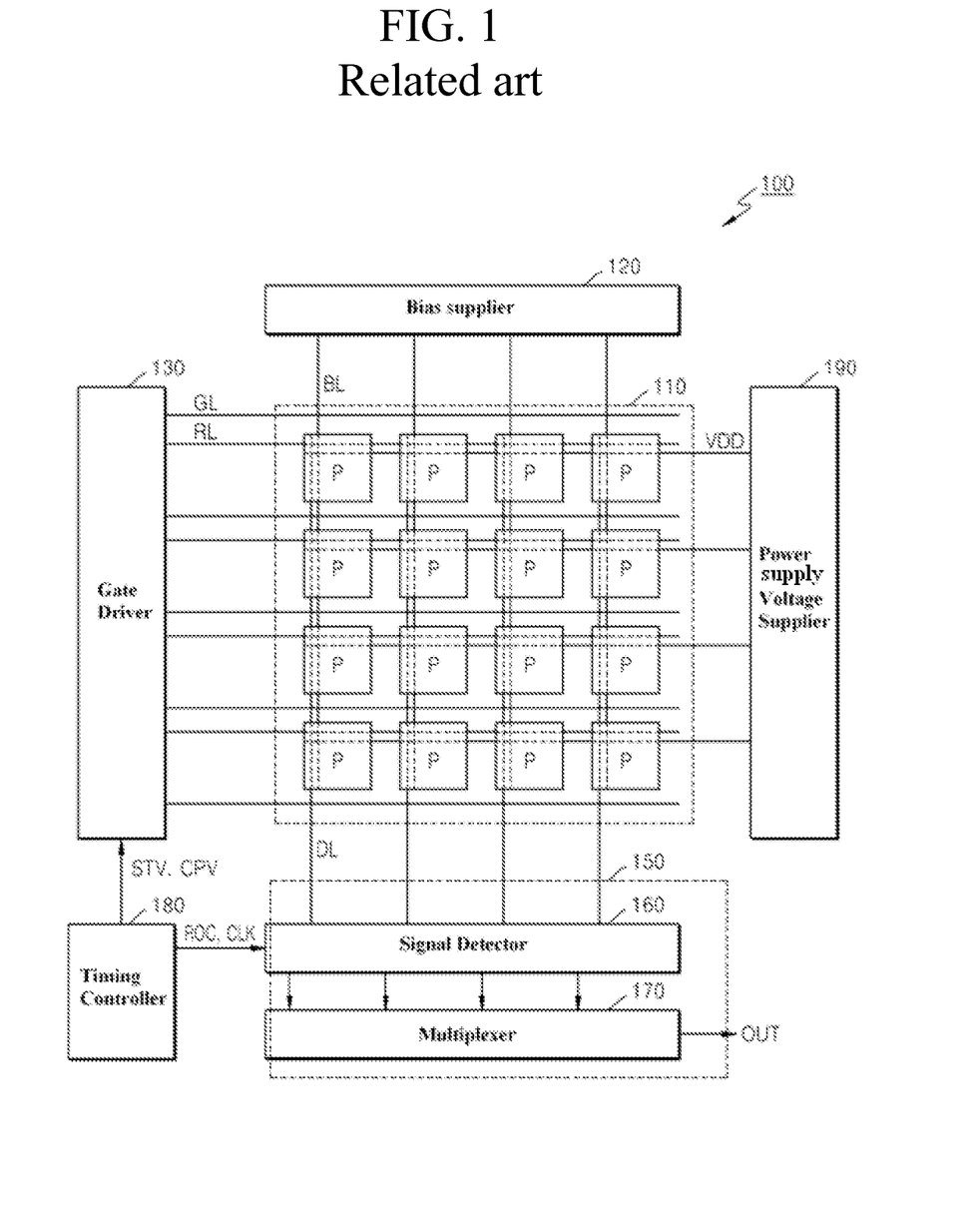
FIG. 1 is a view illustrating a configuration of a general related art digital X-ray detector.

FIG. 1 is a view illustrating a configuration of a general digital X-ray detector 100. As shown in FIG. 1, the general digital X-ray detector 100 includes a thin film transistor array substrate 110, a bias supplier 120, a gate driver 130, a readout integrated circuit 150, a timing controller 180, and a power-supply voltage supplier 190. The readout integrated circuit 150 includes a signal detector 160 and a multiplexer 170.

The thin film transistor array substrate 110 detects an X-ray emitted from an energy source, converts the detected X-ray into an electric signal, and outputs an electric signal. The thin film transistor array substrate 110 includes a plurality of gate lines (GL), a plurality of data lines (DL) arranged in a vertical direction to the gate lines (GL) to define respective cell regions, and a plurality of photosensitive pixels (P) arranged in a matrix form in respective cell regions by the gate lines and the data lines.

Each photosensitive pixel (P) includes a photodiode (PD) that detects an X-ray and outputs a detection signal, e.g., photo-detection voltage, and at least one switching device for transmitting the detection signal output from the photodiode (PD) in response to a gate pulse. For example, the switching device is a transistor. Hereinafter, a configuration in which the switching device is a transistor will be described.

The photodiode (PD) senses an X-ray emitted from an energy source 10 and outputs the sensed signal as a detection signal. The photodiode (PD) is a device that converts incident light into an electrical detection signal through photoelectric effect and is, for example, a PIN diode a having structure including a p-type semiconductor layer, an intrinsic (I) semiconductor layer and an n-type semiconductor layer laminated in this order diode.

The bias supplier 120 applies a driving voltage through a plurality of bias lines (BL). The bias supplier 120 may apply a predetermined voltage to the photodiode (PD), or selectively apply a reverse bias or a forward bias thereto.

The gate driver 130 sequentially applies gate pulses having a gate-on voltage level through the gate lines (GL). In addition, the gate driver 130 may apply reset pulses having a gate-on voltage level to a plurality of reset lines (RL). The gate-on voltage level is a voltage level that turns on transistors of the photosensitive pixels (P). The transistors of the photosensitive pixels (P) may be turned on in response to the gate pulse or the reset pulse.

The detection signal output from the photodiode (PD) in response to the gate pulse is input through the data lines (DL) to the readout integrated circuit 150. The gate driver 130 may be mounted in an IC form at one side of the thin film transistor array substrate 110, or formed on a substrate, such as the thin film transistor array substrate 110, through a thin film process.

The readout integrated circuit 150 reads out the detection signal output from the turned-on transistor in response to the gate pulse. The readout integrated circuit 150 read outs a detection signal output from the photosensitive pixel P in an offset readout region to read out an offset image and an X-ray readout region to read out a detection signal after X-ray exposure.

The readout integrated circuit 150 may include a signal detector 160 and a multiplexer 170.

The signal detector 160 includes a plurality of amplification units that correspond to the data lines (DL) one to one and each amplification unit includes an amplifier (OP), a capacitor (CP), and a reset device (SW).

The timing controller 180 generates a start signal (STV), a clock signal (CPV) or the like and outputs the same to the gate driver 130 in order to control operation of the gate driver 130. In addition, the timing controller 180 generates a readout control signal (ROC), a readout clock signal (CLK) or the like and outputs the same to readout integrated circuit 150 in order to control operation of the readout integrated circuit 150. The gate driver 130 and the readout integrated circuit 150 may be operated using separate clock signals.

The power-supply voltage supplier 190 supplies a power-supply voltage to the photosensitive pixels (P) through the power-supply voltage lines (VDD).

A unit cell structure of the thin film transistor array for the X-ray detector will be described below.

Figure 2:
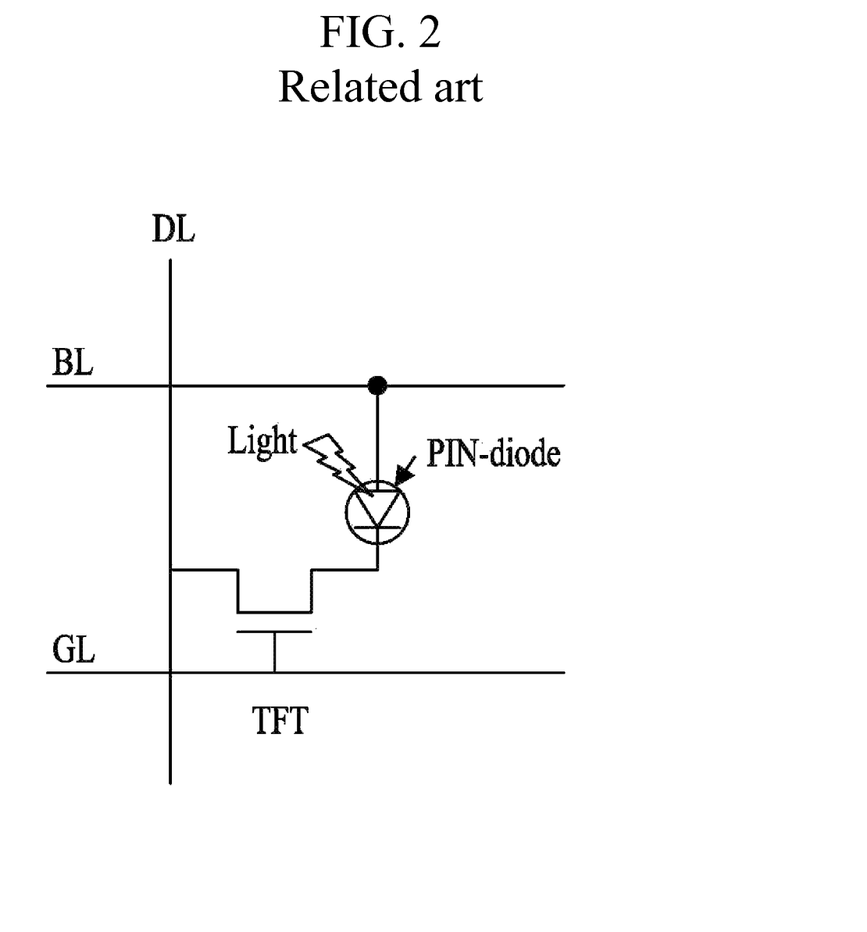
FIG. 2 is a view illustrating a circuit configuration of a unit cell of a related art thin film transistor array substrate for a digital X-ray detector.
Figure 3:
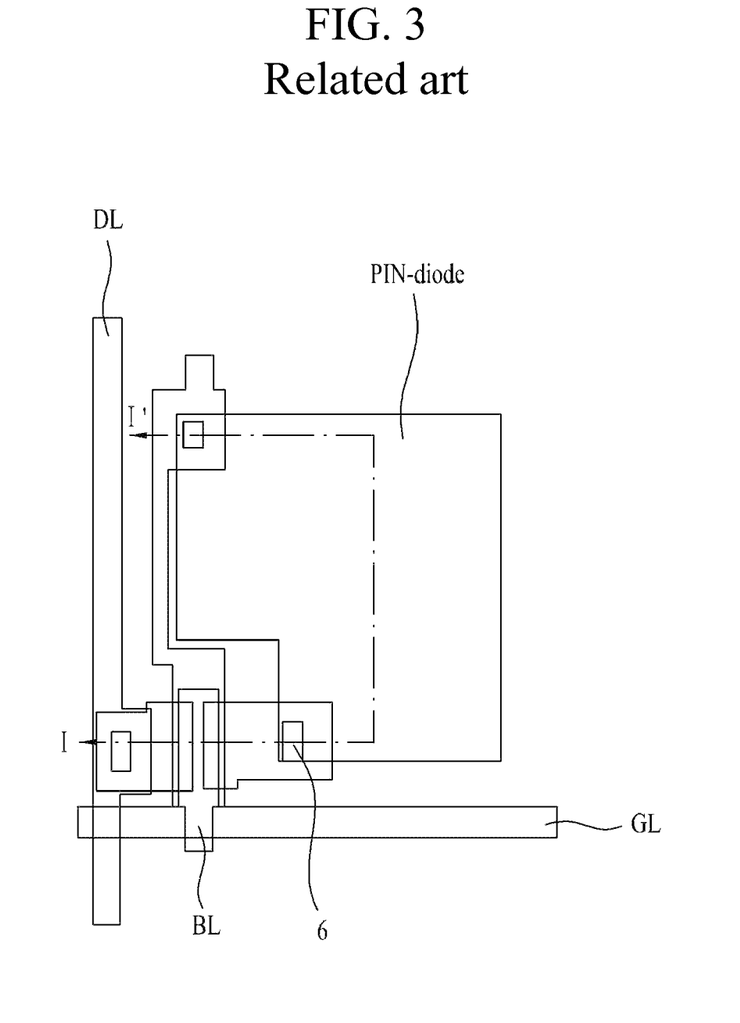
FIG. 3 is a plan view illustrating the unit cell of the related art thin film transistor array substrate for a digital X-ray detector.
Figure 4:
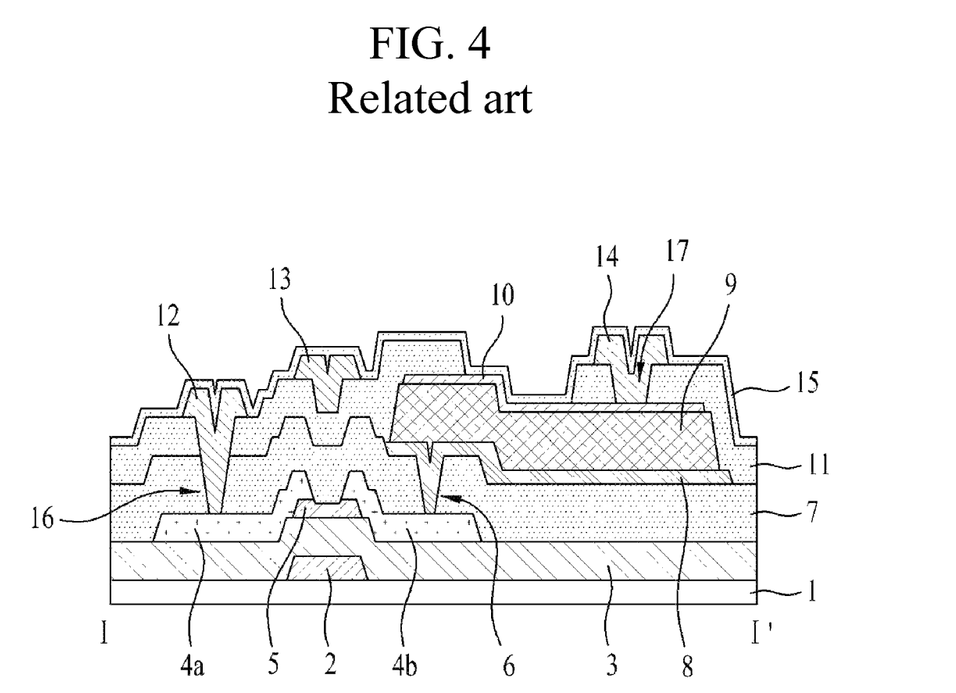
FIG. 4 is a sectional view taken along the line I-I' of the unit cell of the related art thin film transistor array substrate for a digital X-ray detector shown in FIG. 3.

FIG. 2 is a view illustrating a circuit configuration of a unit cell of a related art thin film transistor array substrate for a digital X-ray detector, FIG. 3 is a plan view illustrating the unit cell of the related art thin film transistor array substrate for a digital X-ray detector, and FIG. 4 is a sectional view taken along the line I-I' of the unit cell of the related art thin film transistor array substrate for a digital X-ray detector.

The unit cell of the related art thin film transistor array substrate for a digital X-ray detector includes a plurality of gate lines (GL) to supply a scan signal, a plurality of data lines (DL) arranged in a direction vertical to the gate lines (GL) to output a data, a photodiode (e.g., a PIN-diode) formed in respective cell regions defined by the gate lines and the data lines to perform photoelectric conversion, a thin film transistor (TFT) formed at each of intersections between the gate lines (GL) and the data lines (DL) to turn on according to the scan signal of the gate lines and output the signal photoelectrically converted in the photodiode to the data lines, and a plurality of bias lines (BL) to apply a bias voltage to the photodiode. Here, a source electrode of the thin film transistor is connected to a first electrode of the photodiode in a lower part of the photodiode.

The cross-sectional structure of such a unit cell will be described below. As shown in FIG. 4, the gate line (represented by "GL" in FIGS. 2 and 3) and a gate electrode 2 protruding from the gate line are formed on a substrate 1, and a gate insulating film 3 is formed over the entire surface of the gate electrode 2.

In addition, an active layer 5 is formed on the gate insulating film 3 in a upper part of the gate electrode 2, and a drain electrode 4a and a source electrode 4b are formed at both sides of the active layer 5 to constitute the thin film transistor. A first interlayer insulating film 7 is formed over the entire surface of the substrate including the drain electrode 4a and the source electrode 4b, and the first interlayer insulating film 7 arranged on the source electrode 4b of the thin film transistor is selectively removed to form a first contact hole 6.

A first electrode 8 of the photodiode is formed on the first interlayer insulating film 7 such that it is connected to the source electrode 4b of the thin film transistor through the first contact hole 6. A semiconductor layer 9 having a p-type semiconductor layer, an intrinsic semiconductor layer and an n-type semiconductor layer is formed on the first electrode 8, and a second electrode 10 of the photodiode is formed on the semiconductor layer 9.

A second interlayer insulating film 11 is formed on the first interlayer insulating film 7 arranged over the entire surface of the substrate provided with the second electrode 10 of the photodiode, the first and second interlayer insulating films 7 and 11 arranged on the drain electrode 4a of the thin film transistor are selectively removed to form a second contact hole 16, and the second interlayer insulating film 11 arranged over the second electrode 10 of the photodiode is selectively removed to form a third contact hole 17.

A data line 12 (DL) connected through the second contact hole 16 to the drain electrode 4a of the thin film transistor is formed on the second interlayer insulating film 11. A light-shielding layer 13 is formed in a upper part of a channel region of the thin film transistor, and a bias line 14 (BL) connected through the third contact hole 17 to the second electrode 10 of the photodiode is formed. In addition, a protective film 15 is formed over the entire surface of the substrate.

As shown in FIGS. 3 and 4, the first contact hole 6 to connect the first electrode 8 for the photodiode to the source electrode 4b of the thin film transistor is formed under the photodiode.

The related art thin film transistor array substrate for a digital X-ray detector having this configuration operates as follows.

When an X-ray is irradiated, current flows in the photodiode according to amount of light corresponding to an intensity of the X-ray, and when a scan signal (a gate high voltage) is applied to the gate line, the thin film transistor turns on and outputs an optical signal through the data line.

However, the related art thin film transistor array substrate for a digital X-ray detector having this configuration has the following problems.

The general digital X-ray detector does not prevent current from flowing in the photodiode in a dark state, if it has an ideal structure. However, in the dark state, a dark current flows.

Figure 5:
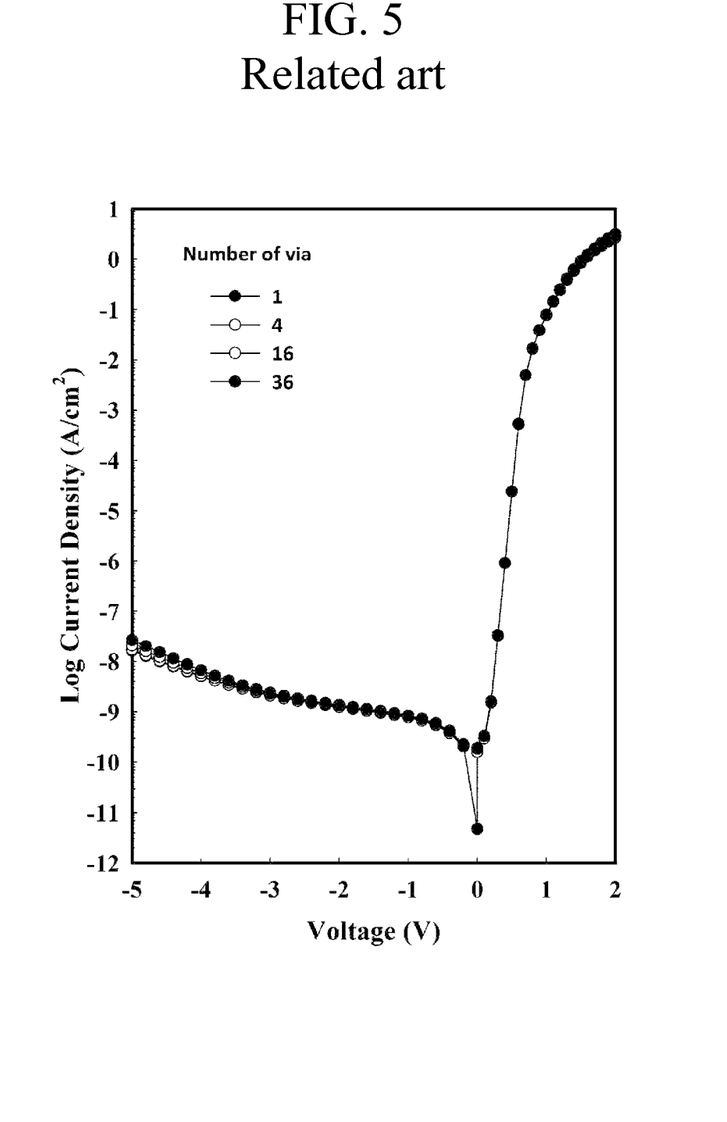
FIG. 5 is a graph showing leakage current measurement results when the numbers of contact holes are 1, 4, 16 and 36, and when an inclination angle of contact holes is predetermined.

FIG. 5 is a graph showing leakage current measurement results when the numbers of contact holes are 1, 4, 16 and 36, and an inclination angle of contact holes is predetermined.

However, the thin film transistor array substrate for a digital X-ray detector has a low integration level that is not sufficient to reduce the inclination angle of the contact hole to a predetermined level. In addition, when exposure and etching processes for forming the contact hole are performed under partially different conditions, rather than under the same conditions, over the entire surface of the thin film transistor array substrate, leakage current characteristics are changed according to respective unit cells. Accordingly, reliability of the X-ray detector is deteriorated. In addition, characteristics of the photodiode are changed due to a source/drain electrode step of the thin film transistor, since the contact hole to connect the source electrode 4b of the thin film transistor to the first electrode 8 of the photodiode is formed in a lower part of the photodiode.

SUMMARY OF THE INVENTION

Accordingly, the present invention is directed to a thin film transistor array substrate for a digital photo-detector that substantially obviates one or more problems due to limitations and disadvantages of the related art.

An object of the present invention is to provide a thin film transistor array substrate for a digital photo-detector that reduces leakage current (dark current) of a photodiode of the digital photo-detector by forming a contact hole to connect a source electrode of a thin film transistor to a first electrode of the photodiode in an outside of the photodiode rather than a lower part of the photodiode.

Additional features and advantages of the invention will be set forth in the description which follows, and in part will be apparent from the description, or may be learned by practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described, a thin film transistor array substrate for a digital photo-detector comprises a plurality of gate lines to supply a scan signal; a plurality of data lines to output data, the data lines arranged in a direction crossing the gate lines, wherein cell regions are defined by the gate lines and the data lines; a photodiode in each of the cell regions to perform photoelectric conversion; and a thin film transistor at each intersection between the gate lines and the data lines to turn on according to the scan signal of the gate lines and output the photoelectric conversion signal from the photodiode to the data lines, wherein a contact area between a source electrode of the thin film transistor and a first electrode of the photodiode is at a portion outside an area covered by a photodiode region.

In another aspect, a thin film transistor array substrate for a digital photo-detector comprises a substrate; a thin film transistor disposed on the substrate, the thin film transistor including a gate electrode, a source electrode and a drain electrode; an interlayer insulating film disposed over the surface of the substrate, the interlayer insulating film defining a contact hole at the source electrode; a first electrode of a photodiode on the interlayer insulating film such that the first electrode is connected to the source electrode of the thin film transistor through the contact hole; a semiconductor layer disposed on a portion of the first electrode; and a second electrode of the photodiode disposed on the semiconductor layer, wherein the contact hole is disposed a portion outside an area covered by the semiconductor layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

While examples will be given in the context of X-ray detectors, it should be readily recognized that the detector can be applied to various types of electromagnetic radiation. Thus, the following description will use X-ray detectors as an example for discussion and illustration, but applies to photodetectors generally.

The present inventors established why dark current flows in the dark state. Through the causal analysis result, it can be seen that when the contact hole 6 of FIGS. 3 and 4, which connects the source electrode 4b of the thin film transistor to the first electrode 8 of the photodiode, has a large inclination angle, leakage current increases in proportion to the number of contact holes. Generally, the contact hole 6 to connect the source electrode 4b of the thin film transistor to the first electrode 8 of the photodiode is formed by dry etching, and the inclination angle of the contact hole is changed according to a thickness of the interlayer insulating film and a diameter of the contact hole. In addition, the leakage current is changed according to the inclination angle of the contact hole, and the leakage current is not affected by the number of contact holes, as determined by measurement results of leakage current at a predetermined angle of the contact holes.

Hereinafter, a thin film transistor array substrate for a digital X-ray detector according to the present invention will be described in detail with reference to the drawings.

Figure 6:
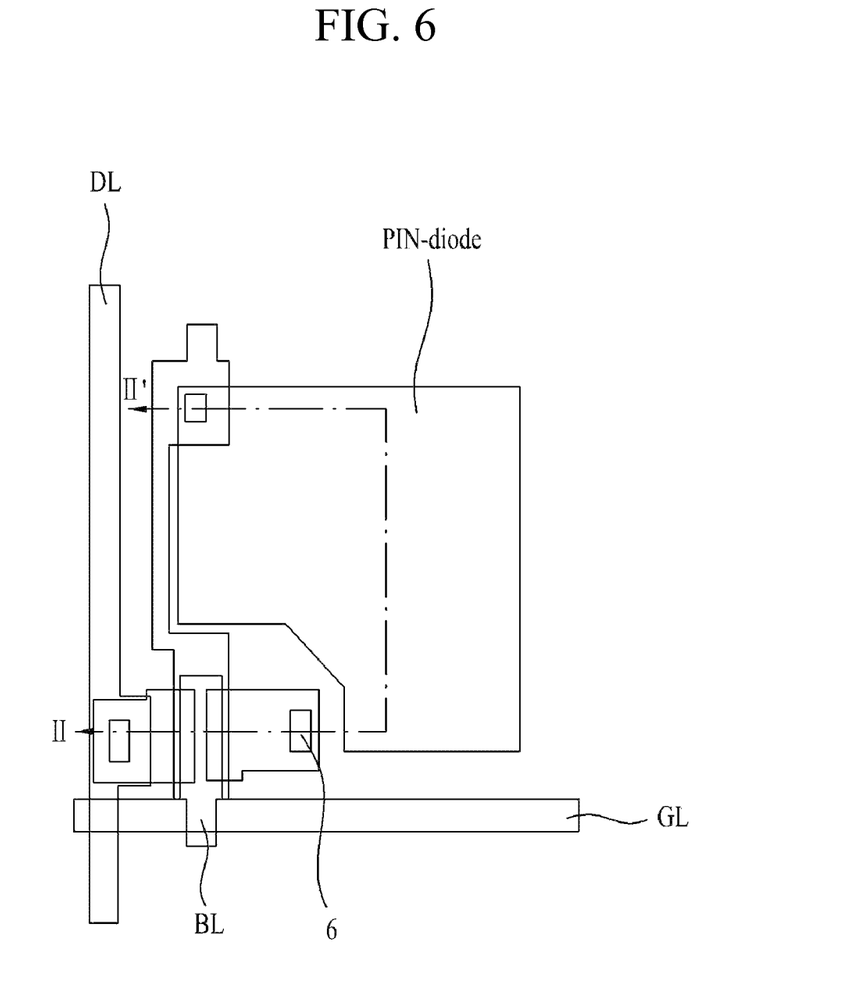
FIG. 6 is a plan view illustrating a unit cell of a thin film transistor array substrate for a digital X-ray detector according to an example configuration of the present invention.
Figure 7:
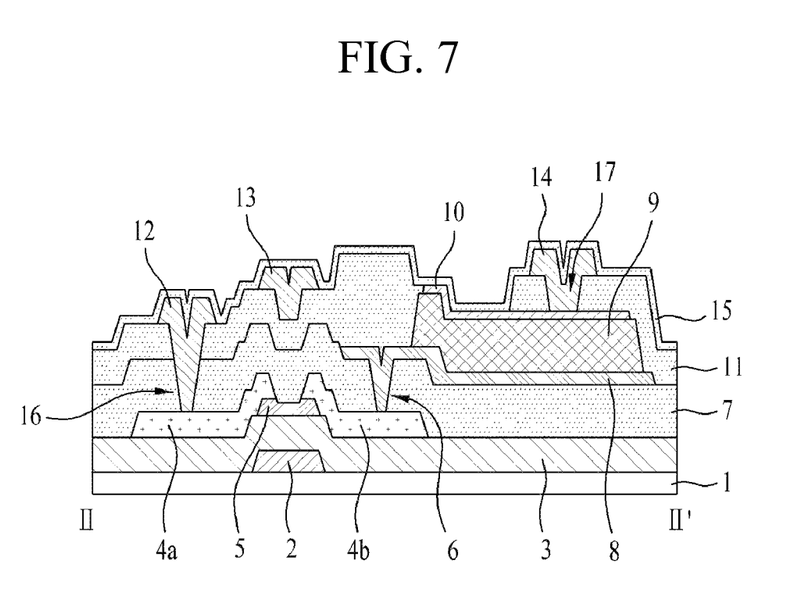
FIG. 7 is a sectional view taken along line II-II' of FIG. 6 of the unit cell of the thin film transistor array substrate for a digital X-ray detector shown.

FIG. 6 is a plan view illustrating a unit cell of a thin film transistor array substrate for a digital X-ray detector according to an example configuration of the present invention. FIG. 7 is a sectional view taken along line II-II' of FIG. 6 of the unit cell of the thin film transistor array substrate for a digital X-ray detector.

In FIGS. 5 and 6, the unit cell of the thin film transistor array substrate for a digital X-ray detector includes a plurality of gate lines (GL) to supply a scan signal, a plurality of data lines (DL) arranged in a vertical direction to the gate lines (GL) to output a data, a photodiode (PIN-diode) formed in each of cell regions defined by the gate lines (GL) and the data lines (DL) to perform photoelectric conversion, a thin film transistor (TFT) formed at each of intersections between the gate lines (GL) and the data lines (DL) to turn on according to the scan signal of the gate line (GL) and output the photoelectric conversion signal from the photodiode to the data lines (DL), and a plurality of bias lines (BL) to apply a bias voltage to the photodiode. A source electrode of the thin film transistor is connected to a first electrode of the photodiode outside of the photodiode.

The cross-sectional structure of such a unit cell will now be described.

As shown in FIG. 7, the gate line (represented by "GL" in FIG. 6) and a gate electrode 2 protruding from the gate line are formed on a substrate 1, and a gate insulating film 3 is formed over an entire surface of the substrate 1 including the gate electrode 2. In addition, an active layer 5 is formed on the gate insulating film 3 over the gate electrode 2, and a drain electrode 4a and a source electrode 4b are formed at both sides of the active layer 5 to constitute the thin film transistor.

A first interlayer insulating film 7 is formed over the entire surface of the substrate including the drain electrode 4a and the source electrode 4b. Then the first interlayer insulating film 7 arranged on the source electrode 4b of the thin film transistor is selectively removed to form a first contact hole 6.

A first electrode 8 of the photodiode is formed on the first interlayer insulating film 7 such that it is connected to the source electrode 4b of the thin film transistor through the first contact hole 6. A semiconductor layer 9 having a p-type semiconductor layer, an intrinsic semiconductor layer and an n-type semiconductor layer is formed on the first electrode 8 and a second electrode 10 of the photodiode is formed on the semiconductor layer 9.

The semiconductor layer 9 and the second electrode can be formed to be not over the first contact hole 6. That is, as shown in FIG. 6, the semiconductor layer 9 and the second electrode 10 may be formed in a pixel region such that they do not overlap a contact area of the source electrode 4b of the thin film transistor.

A second interlayer insulating film 11 is formed on the first interlayer insulating film 7 arranged over the entire surface of the substrate provided with the second electrode 10 of the photodiode. The first and second interlayer insulating films 7 and 11 arranged on the drain electrode 4a of the thin film transistor are selectively removed to form a second contact hole 16. The second interlayer insulating film 11 arranged over the second electrode 10 of the photodiode is selectively removed to form a third contact hole 17.

A data line 12 (DL) connected through the second contact hole 16 to the drain electrode 4a of the thin film transistor is formed on the second interlayer insulating film 11, a light-shielding layer 13 is formed over a channel region of the thin film transistor, and a bias line 14 (BL) connected through the third contact hole 17 to the second electrode 10 of the photodiode is formed. In addition, a protective film 15 is formed over the entire surface of the substrate.

As shown in FIGS. 6 and 7, the first contact hole 6 to connect the first electrode 8 of the photodiode to the source electrode 4b of the thin film transistor is formed outside of the photodiode, rather than in a lower part of the photodiode.

The thin film transistor array substrate for a digital photo-detector having this configuration has the following advantages.

The thin film transistor array substrate for digital a photo-detector according to this configuration can reduce leakage current (dark current) of the photodiode of the digital photo-detector. Although an inclination angle of the contact hole is not reduced to a predetermined level or lower because the contact hole to connect the source electrode of the thin film transistor to the first electrode of the photodiode is formed outside of the photodiode, rather than in a lower part of the photodiode.

In addition, leakage current characteristics are uniform and reliability of the photo-detector is thus improved because the contact hole is formed outside of the photodiode area, although exposure and etching processes for forming the contact hole are changed. In addition, since the contact hole is formed outside of the photodiode area, although a position of the source electrode of the thin film transistor is changed, a size of the source electrode is reduced and variation in characteristics of the photodiode caused by a step of the source electrode is thus prevented.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor array substrate for a digital photo-detector, comprising:
    a plurality of gate lines to supply a scan signal;
    a plurality of data lines to output data, the data lines arranged in a direction crossing the gate lines, wherein cell regions are defined by the gate lines and the data lines;
    a photodiode in each of the cell regions to perform photoelectric conversion; and
    a thin film transistor at each intersection between the gate lines and the data lines to turn on according to the scan signal of the gate lines and output the photoelectric conversion signal from the photodiode to the data lines,
    wherein a contact area between a source electrode of the thin film transistor and a first electrode of the photodiode is at a portion outside an area covered by a photodiode region.

2. A thin film transistor array substrate according to claim 1, wherein the photodiode includes the first electrode, a semiconductor layer, and a second electrode.

3. The thin film transistor array substrate according to claim 2, wherein the first electrode extends beyond a periphery of the semiconductor layer such that the extended portion of the first electrode contacts the source electrode.

4. The thin film transistor array substrate according to claim 2, wherein the semiconductor layer is disposed to be laterally displaced relative to the contact area between the first electrode and the source electrode such that a portion of the first electrode not covered by the semiconductor layer contacts the source electrode.

5. The thin film transistor array substrate according to claim 2, wherein the first electrode connects to the source electrode through a contact hole, and wherein the semiconductor layer does not overlap the contact hole.

6. The thin film transistor array substrate according to claim 2, wherein the first electrode connects to the source electrode through a contact hole, and wherein the semiconductor layer does not overlap the source electrode of the thin film transistor.

7. The thin film transistor array substrate according to claim 2, wherein the first electrode connects to the source electrode through a contact hole, and wherein the semiconductor layer is laterally displaced relative to the contact hole.

8. The thin film transistor array substrate according to claim 1, further comprising a bias line to apply a bias voltage to each photodiode.

9. The thin film transistor array substrate according to claim 1, wherein the photodiode is configured to detect X-rays.

10. The thin film transistor array substrate according to claim 1, wherein the photodiode includes a PIN diode for detecting X-rays.

* * * * *